United States Patent
Shukla et al.

(10) Patent No.: US 7,035,328 B2
(45) Date of Patent: Apr. 25, 2006

(54) METHOD OF SLEWING A DIGITAL FILTER PROVIDING FILTER SECTIONS WITH MATCHED GAIN

(76) Inventors: Sunil Shukla, 5141 Heather Dr., Apt. 206, Dearborn, MI (US) 48126; Mark W. Corless, 2658 Edgemont, Trenton, MI (US) 48183; J. William Whikehart, 47266 Cider Mill Dr., Novi, MI (US) 48374

( * ) Notice: Subject to any disclaimer, the term of this patent is extended or adjusted under 35 U.S.C. 154(b) by 743 days.

(21) Appl. No.: 10/122,529

(22) Filed: Apr. 15, 2002

(65) Prior Publication Data

US 2002/0136289 A1   Sep. 26, 2002

Related U.S. Application Data

(63) Continuation-in-part of application No. 09/247,214, filed on Feb. 8, 1999, now Pat. No. 6,445,735, which is a continuation-in-part of application No. 09/382,727, filed on Aug. 25, 1999, now Pat. No. 6,393,450.

(51) Int. Cl.
*H03K 5/159* (2006.01)
*G06F 17/10* (2006.01)

(52) U.S. Cl. .................. 375/232; 708/300; 708/320

(58) Field of Classification Search ............... 375/232; 450/130; 455/307, 339, 340, 206; 708/316, 708/322, 300, 310, 320
See application file for complete search history.

(56) References Cited

U.S. PATENT DOCUMENTS

| | | | | |
|---|---|---|---|---|
| 5,157,623 A | * | 10/1992 | Hayashi | 708/320 |
| 5,856,934 A | * | 1/1999 | Nakajima et al. | 708/300 |
| 6,154,547 A | | 11/2000 | Whitecar | |
| 6,263,354 B1 | * | 7/2001 | Gandhi | 708/320 |

OTHER PUBLICATIONS

Robert Bristow-Johnson, "The equivalence of various methods of computing bi-quad coefficients for audio parametric equalizers." Wave Mechanics Inc. originally published Nov. 1994, 97th Convention of the Audio Engineering Society.*

* cited by examiner

*Primary Examiner*—Jay K. Patel
*Assistant Examiner*—Sophia Vlahos
(74) *Attorney, Agent, or Firm*—MacMillan, Sobanski & Todd LLC

(57) ABSTRACT

A method is provided of slewing a bandwidth characteristic of a digital filter within a range between a first bandwidth characteristic and a second bandwidth characteristic. The digital filter includes a plurality of cascaded filter sections, each filter section being comprised of a second order filter having coefficients $a_1$, $a_2$, $b_0$, $b_1$, and $b_2$. An index value is determined for identifying a desired bandwidth characteristic within the range. Values are interpolated for the coefficient values for the $a_1$ and $a_2$ coefficients of a respective filter section in response to the index value. Coefficient values are derived for the $b_0$, $b_1$, and $b_2$ coefficients in response to the coefficient values for the $a_1$ and $a_2$ coefficients such that the $b_0$, $b_1$, and $b_2$ coefficient values provide a matched gain for the respective filter section. The coefficient values are loaded into the respective filter section.

2 Claims, 8 Drawing Sheets

METHOD OF SLEWING A DIGITAL FILTER PROVIDING FILTER SECTIONS WITH MATCHED GAIN

CROSS REFERENCE TO RELATED APPLICATIONS

This application is a continuation-in-part of U.S. application Ser. No. 09/247,214, filed Feb. 8, 1999, entitled "Switched Bandwidth Digital Filters with Reduced Transients During Switching," now U.S. Pat. No. 6,445,735, issued Sep. 3, 2002, and U.S. application Ser. No. 09/382,727, filed Aug. 25, 1999, entitled "Switched Bandwidth Digital Filters with Slewing," now U.S. Pat. No. 6,393,450, issued May 21, 2002.

This application is also related to concurrently filed U.S. application Ser. No. 10/122,894, entitled "Run-Time Coefficient Generation for Digital Filter with Slewing Bandwidth," and concurrently filed U.S. application Ser. No. 10/122,776, entitled "Method of Designing Polynomials for Controlling the Slewing of Adaptive Digital Filters."

STATEMENT REGARDING FEDERALLY SPONSORED RESEARCH

Not Applicable.

BACKGROUND OF THE INVENTION

The present invention relates in general to adjustable-bandwidth digital filters used in digital signal processing, and, more specifically, to slewing the bandwidth of a digital filter using filter coefficients that are calculated during filter operation and that achieve gain matching at each filter section throughout slewing of the filter.

Digital filters manipulate discrete samples of an input signal to produce a filtered output signal. Various filter structures are known in the art, such as those for finite impulse-response (FIR) filters and infinite impulse-response (IIR) filters. Higher order IIR filters (which provide more selectivity) are typically implemented using a plurality of lower order filters connected in cascade.

During processing of a signal, it may become necessary to change the filtering of the signal (e.g., a change in bandwidth, passband characteristic, group delay, or other filter parameters). To minimize hardware and/or software requirements, it is desirable to use the same filter structure before and after the change by merely changing the digital filter coefficients.

In a digital signal processing (DSP) radio receiver, for example, a digital channel filter is applied to an intermediate frequency (IF) signal to select the desired signal and reject other broadcast signals. A wide or a narrow passband may be used for the channel filter depending upon the presence of interfering adjacent or alternate channel broadcast signals. When switching between the two bandwidths by switching between two coefficient sets in a DSP filter, the sudden change in bandwidth may be noticeable to the listener and may lead to a perception of poor quality. Audio processing elements in the signal chain, such as an automatic gain control (AGC) loop or a stereo decoder, may malfunction due to the transients and would generate further degradation of the reproduced audio.

As described in co-pending application U.S. Ser. No. 09/382,727, a more gradual change in bandwidth (and thus a reduction of switching effects) can be realized by slewing the filter coefficients through a series of steps rather than hard switching directly between the wide and narrow bandwidths. However, computation requirements or storage requirements for generating a number of distinct filters with the desired characteristics has been undesirably large.

SUMMARY OF THE INVENTION

The present invention has the advantage of maintaining a desired filter characteristic during slewing such that gain matching is achieved at each filter section throughout slewing of the filter.

In one aspect of the invention, a method is provided of slewing a bandwidth characteristic of a digital filter within a range between a first bandwidth characteristic and a second bandwidth characteristic. The digital filter includes a plurality of cascaded filter sections, each filter section being comprised of a second order filter having coefficients $a_1$, $a_2$, $b_0$, $b_1$, and $b_2$. An index value is determined for identifying a desired bandwidth characteristic within the range. Values are interpolated for the coefficient values for the $a_1$ and $a_2$ coefficients of a respective filter section in response to the index value. Coefficient values are derived for the $b_0$, $b_1$, and $b_2$ coefficients in response to the coefficient values for the $a_1$ and $a_2$ coefficients such that the $b_0$, $b_1$, and $b_2$ coefficient values provide a matched gain for the respective filter section. The coefficient values are loaded into the respective filter section.

DETAILED DESCRIPTION OF PREFERRED EMBODIMENTS

Figure 1:
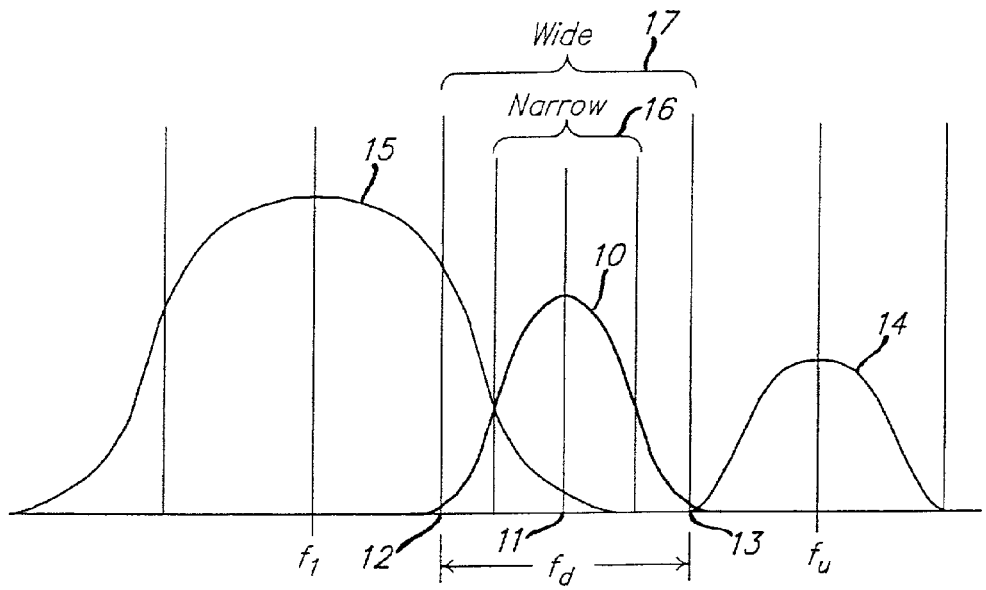
FIG. 1 plots reception field strength in a local reception area in which adjacent channel interference exists for a desired radio channel of interest.

FIG. 1 shows a frequency spectrum 10 of a desired radio broadcast having a center frequency 11 and occupying an assigned channel $f_d$ between a lower frequency 12 and an upper frequency 13. An upper adjacent channel $f_u$ is shown containing a broadcast signal 14 with substantially no excess signal content in the desired frequency channel, whereby the upper adjacent channel is not causing interference. However, a lower adjacent channel at $f_l$ is shown to include a radio broadcast having a frequency spectrum 15 including significant signal content above lower frequency 12 of the desired channel. The resulting interference degrades reception of the desired radio broadcast.

Adjacent channel interference can be reduced by means of narrowing the passband of a bandpass filter in the receiver to reduce the signal content from the adjacent channel passing through the receiver. Thus, FIG. 1 shows a narrow bandwidth 16 which can be switched into the intermediate frequency signal path to alleviate adjacent channel interference. When no adjacent channel interference is present, a wide bandwidth 17 is used in order to maximize quality of the received desired signal. Within the receiver, center frequency 11 is translated to an intermediate frequency, which may be a zero intermediate frequency. In that case, the filter is a lowpass filter.

Figure 2:
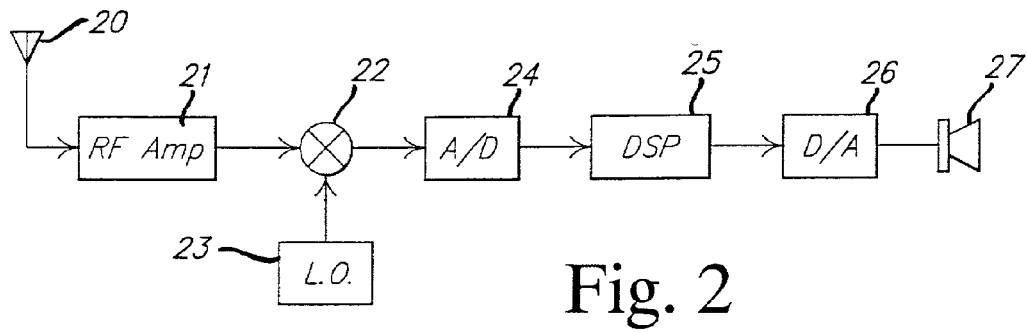
FIG. 2 is a block diagram showing portions of a DSP radio receiver.

FIG. 2 is a block diagram showing a radio receiver using digital signal processing. An antenna 20 receives broadcast RF signals which are coupled to an RF amplifier 21. Amplified RF signals are provided to one input of a mixer 22. A local oscillator 23 provides a mixing signal to a second input of mixer 22, the mixing signal having a frequency under control of a tuning control circuit (now shown). A carrier-based signal in the form of an intermediate frequency (IF) signal is provided from mixer 22 to the input of an analog-to-digital (A/D) converter 24. A digitized IF signal is provided to digital signal processor (DSP) block 25 for filtering, demodulating, and other further processing of the resulting audio signal. Block 25 includes data memory and program memory for performing these functions. A final audio signal is output from DSP 25 to the input of a digital-to-analog (D/A) converter 26 which provides analog audio signals to a speaker system 27.

Figure 3:
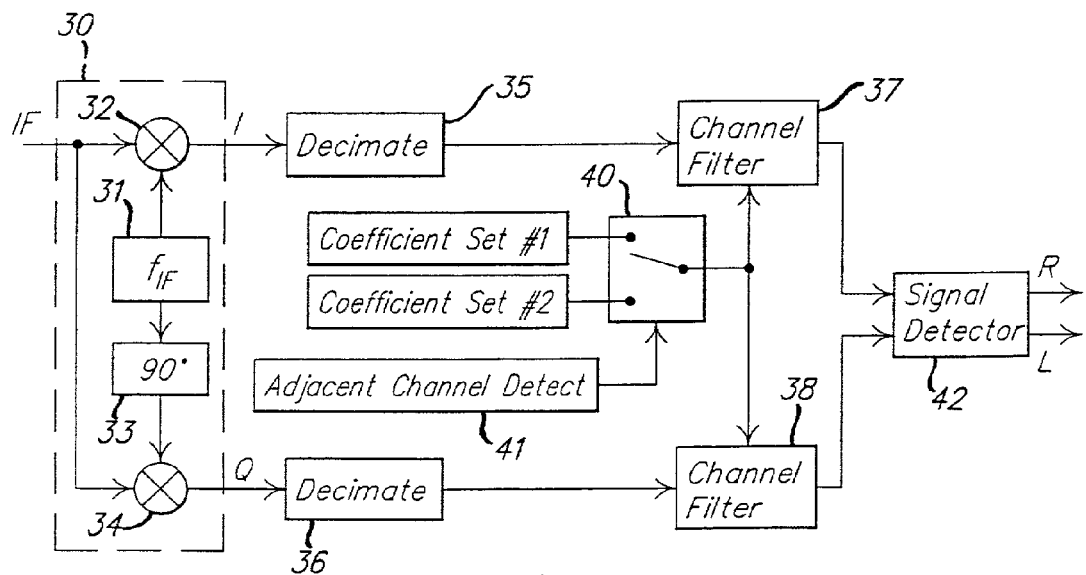
FIG. 3 is a block diagram showing DSP processing of an intermediate frequency signal as used in the present invention.

Processing of the digitized IF signal within DSP 25 is shown in greater detail in FIG. 3. The embodiment of FIG. 3 is particularly adapted for processing AM signals. The digitized IF signal is provided to the input of a complex mixer 30 to produce in-phase (I) and quadrature-phase (Q) signals. An oscillator 31 produces an injection signal $f_{if}$ which is nominally equal to the intermediate frequency of the IF signal so that the IF signal is mixed to a new IF frequency of approximately zero Hertz. The injection signal is coupled directly to one input of a first mixer 32 and through a 90° phase-shift block 33 to an input of a second mixer 34. The digitized IF signal is provided to respective inputs of mixers 32 and 34 to generate the I and Q signals. The I and Q signals are decimated by decimate blocks 35 and 36, respectively, to provide sample-rate-reduced signals to the inputs of channel filters 37 and 38.

Other non-zero IF frequencies or non-complex signal representations can be used with the present invention. However, a zero-IF complex representation has many advantages in DSP processing such as compact code size, minimized chip area, and efficient data manipulation.

Channel filters 37 and 38 can be loaded with any one of a plurality of coefficient sets (e.g., a coefficient set #1 or a coefficient set #2) through a multiplexer 40 under control of an adjacent channel detect block 41. Coefficient set #1 provides a wide bandwidth while coefficient set #2 provides a narrow bandwidth, for example. When slewing between a wide bandwidth and a narrow bandwidth, intermediate coefficient sets are loaded. A coefficient set to be used at any one time is selected depending upon the presence of adjacent channel interferers. Using a zero Hertz intermediate frequency, channel filters 37 and 38 are implemented as low-pass filters with the narrower filter having an upper cutoff frequency which is lower than that of the wider filter. The presence of adjacent channel interferers can be detected using any conventional method as known in the art. The filtered outputs of channel filters 37 and 38 are provided to a signal detector 42 for generating an audio output which may include left and right stereo signals, for example.

The memory blocks for coefficient sets #1 and #2 may further contain coefficient values to be used during slewing of a selected one of the filter sections. Alternatively, information may be stored to allow for these slewing coefficient values to be calculated when needed.

The channel filters may be implemented using various filter structures and types. An infinite impulse response (IIR) filter as shown in FIG. 4 will be described herein as an example since its use is desirable for its advantages of compact size.

Figure 4:
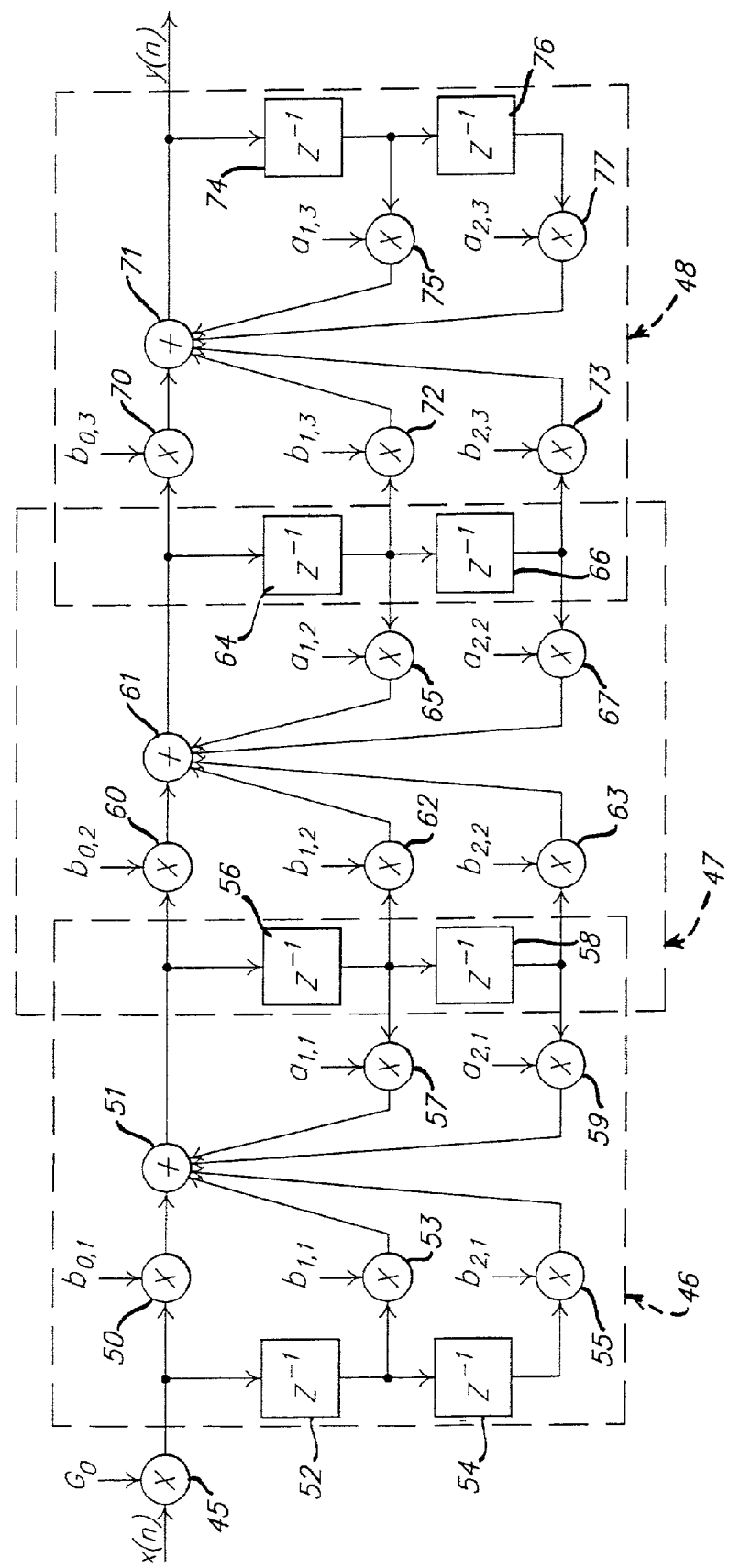
FIG. 4 is a block diagram showing the internal structure of a channel filter employing a cascade of second order filter sections.

FIG. 4 shows a typical architecture for an IIR filter comprising three second-order sections cascaded in series between an input x(n) and an output y(n). A filter may include an overall gain term $G_0$ applied to one input of a multiplier 45 which receives input x(n) at its other input. Alternatively, the gain term $G_0$ may be distributed to the individual sections as is known in the art.

Second order sections 46, 47, and 48 are connected in series to produce a sixth order filter. First section 46 includes a multiplier 50 for multiplying the input to section 46 by a coefficient $b_{0,1}$. The resulting product is provided to one input of a summer 51. The output of summer 51 provides the output node for section 46, and is also an internal node of the whole filter.

The input to section 46 is delayed by one sample period in a unit delay block 52 and then input to a multiplier 53. Coefficient $b_{1,1}$ is applied to a second input of multiplier 53 and the output is provided to summer 51. The output of unit delay block 52 is passed through a further unit delay in unit delay block 54 prior to multiplying it in a multiplier 55 by a coefficient $b_{2,1}$. The output of multiplier 55 is provided to yet another input of summer 51. The b coefficients provide the feedforward terms for section 46. Section 46 also includes feedback terms wherein the output of summer 51 is delayed in a unit delay block 56. The delayed output is coupled to a multiplier 57 which also receives a coefficient $a_{1,1}$. The output of multiplier 57 is coupled to another input of summer 51. The delayed output from unit delay block 56 is passed through a unit delay block 58 and then to an input of a multiplier 59. Coefficient $a_{2,1}$ is supplied to another input of multiplier 59 and the resulting product is coupled to summer 51. The a coefficients provide the feedback terms for section 46. The output of summer 51, comprising the internal node for the first section 46, is coupled to the input of second section 47. Sections 46 and 47 are shown overlapping since unit delay blocks 56 and 57 are shared between the two section operations in order to minimize hardware requirements.

The input of section 47 (from summer 51) is applied to a multiplier 60 which also receives coefficient $b_{0,2}$. Additional b coefficients $b_{1,2}$ and $b_{2,2}$ are applied to multipliers 62 and 63, respectively, and the resulting products are added in a summer 61. Unit delay block 64, multiplier 65, unit delay block 66, and multiplier 67 provide feedback terms using coefficients $a_{1,2}$ and $a_{2,2}$, as in the previous section. Section 48 operates in the same manner using b coefficients for the third section $b_{0,3}$, $b_{1,3}$ and $b_{2,3}$ and a coefficients $a_{1,3}$ and $a_{2,3}$.

In order to provide a final filtering of higher order, more second order sections may be cascaded in series after section 48.

Various methods are well known for determining appropriate values for the a and b coefficients for a desired bandwidth characteristic using various types of filters (e.g., Butterworth, Chebyshev, or Elliptic). Filter sections implemented in DSP hardware can provide different selected bandwidth characteristics by loading different a and b coefficients. For example, first and second coefficient sets have been separately derived (in advance by a filter designer) for providing a first bandwidth characteristic and a second bandwidth characteristic, respectively, in order to switch a filter between bandwidths while using the same filter hardware and structure as shown in FIG. 3. By swapping coefficient values between the two coefficient sets during operation of the radio receiver, either the wide bandwidth or the narrow bandwidth channel filter can be selected. As used herein, a coefficient set refers to all the a and b coefficients for all the filter sections for providing one bandwidth characteristic.

Using the coefficient sets as obtained with the conventional process, significant audible effects may occur in the audio output when the filter coefficients are changed. Copending application Ser. No. 09/382,727 teaches a gradual change in the overall filter characteristic to reduce the audible change in frequency response and other effects.

Figure 5A:
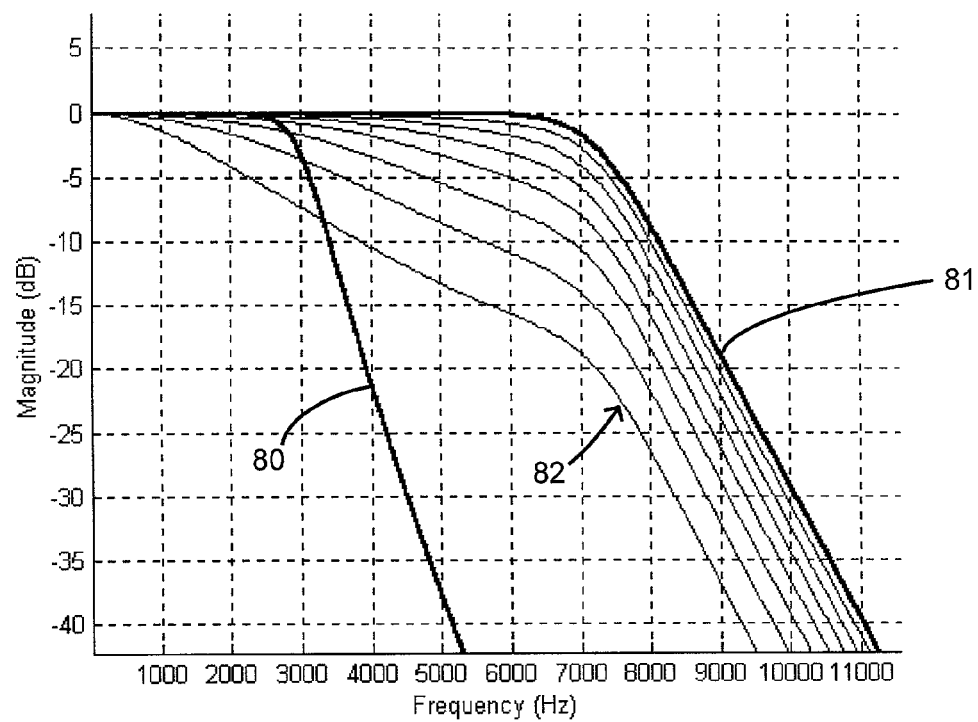
FIGS. 5a and 5b are plots showing intermediate filter characteristics using linear slewing of coefficients.
Figure 5B:
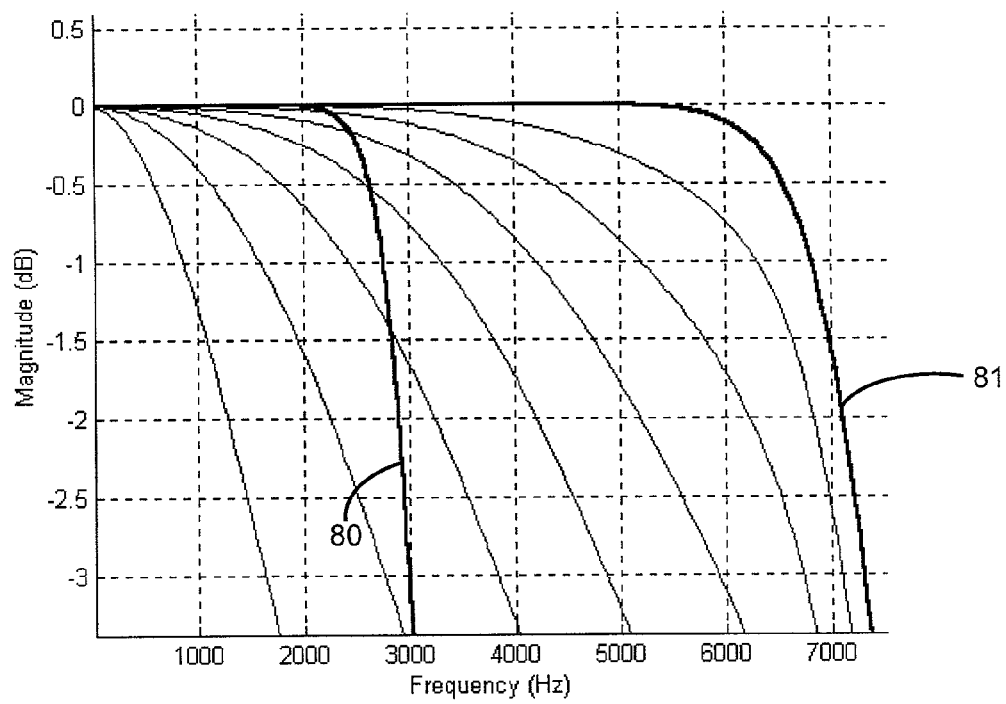

If the bandwidth were to be slewed in discrete steps by using conventional coefficient design techniques at all the desired intermediate bandwidths between the wide and narrow settings, a large amount of memory and/or computational resources would be required. If 50 intermediate steps were used, then 50 different full coefficient sets would have to be stored which would be costly in terms of memory storage and in terms of processor overhead for passing stored coefficients in and out of the processor. Copending application Ser. No. 09/382,727 slews coefficients of a single filter section wherein the slewed coefficient values are stepped linearly between their initial and final values. FIG. 5a shows stopband attenuation achieved by linear slewing of filter coefficients for one filter section as described by the copending application. A curve 80 shows the characteristic for the narrowband filter and curve 81 shows the characteristic for the wideband filter. Intermediate curves 82 show the characteristics of intermediate filters obtained by the linear slewing, which deviate significantly from the ideal shapes of curves 80 and 81. FIG. 5b shows passband attenuation for the same slewing as shown in FIG. 5a. It can be seen that after the filter has slewed through the interpolated coefficient values and when the ideal values derived for the endpoint (i.e., narrow or wide) filters are then loaded into the filter section, an abrupt change in filter characteristic results.

The present invention provides a more ideal filter characteristic during bandwidth switching, thereby avoiding secondary effects associated with non-ideal intermediate characteristics. Furthermore, this invention provides intermediate bandwidth characteristics that meet performance specifications that allow them to be employed for obtaining bandwidth characteristics that are used for long term filtering (i.e., not only for short periods during slewing). Thus, the invention can be used to achieve a variable bandwidth digital filter having low computational and memory requirements.

Figure 6A:
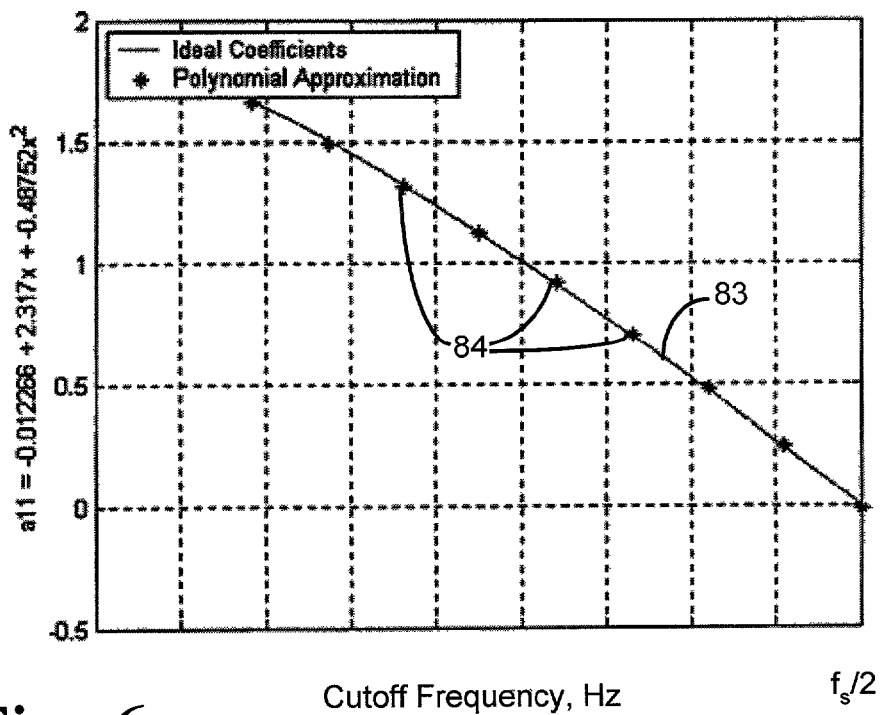
FIGS. 6a and 6b show second-order polynomial approximations for matching of ideal filter coefficients.
Figure 6B:
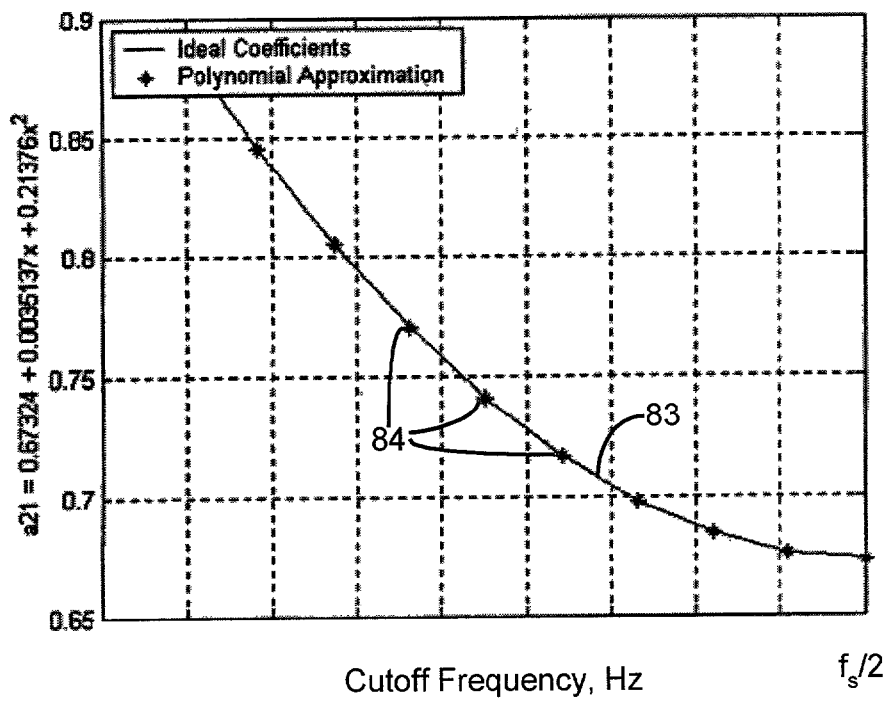
Figure 7A:
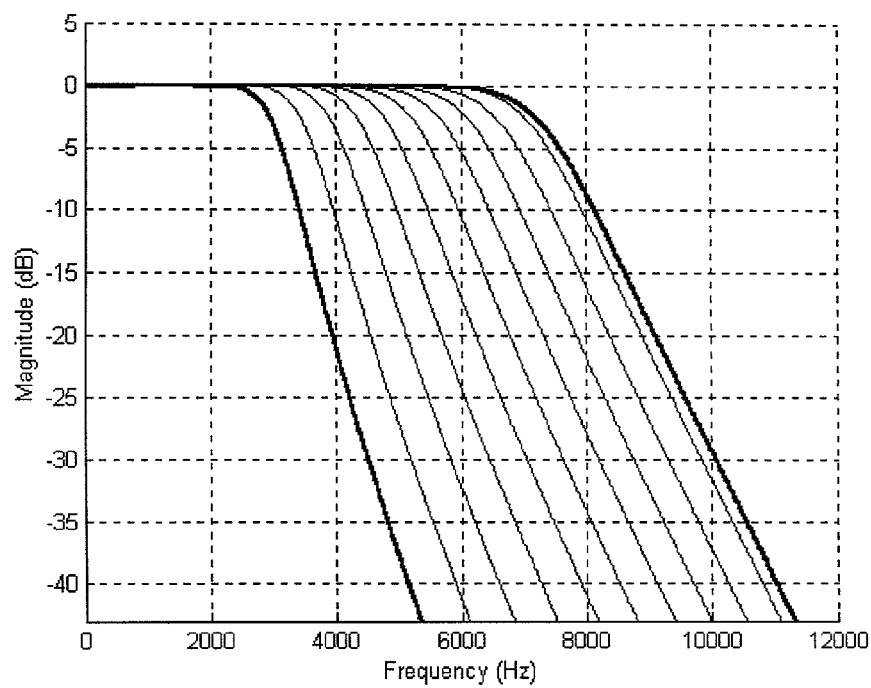
FIGS. 7a and 7b are plots showing intermediate filter characteristics using second-order polynomial approximations for slewing of coefficients.
Figure 7B:
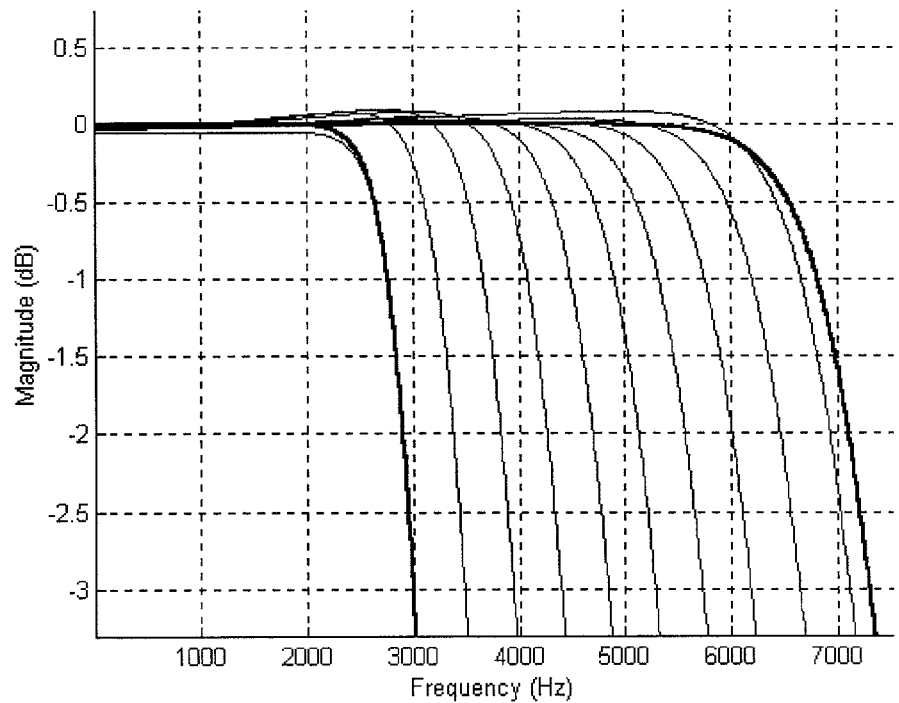

The present invention models the variance of individual coefficients of one or more sections of a multiple section digital filter using second order polynomials as shown in FIGS. 6a and 6b. Curves 83 represent an idealized variability of the values of the $a_1$ and $a_2$ terms within a particular section of a lowpass filter over a range of cutoff frequencies of the filter. By actually designing only a few of these continuous, ideal filters, the present invention matches the resulting coefficient values to a second order polynomial for each coefficient. For example, a polynomial of FIG. 6a is shown as $a_1 = -0.012266 + 2.317i + (-0.48752i^2)$, where i is an index corresponding to the cutoff frequency of the desired filter (e.g., in terms of a percentage of the sampling frequency of the digital system). FIG. 6b leads to a polynomial approximation of $a_2 = 0.67324 + 0.0035137i + 0.21376i^2$. In response to any desired bandwidth (i.e., cutoff frequency), index i can be input to the corresponding polynomials to generate a polynomial approximation (as shown by points 84) of the a terms using very little computational and memory resources. As described below, the b terms of each filter section may be calculated in response to the values of the a terms. The resulting improvement in the characteristics of the intermediate filters is shown in FIGS. 7a and 7b which plot the stopband and the passband, respectively.

By way of an example for an $8^{th}$ order AM channel filter in the form of an IIR filter implemented as four cascaded second order direct form sections, the transfer function for each section is given as:

$$H_X(z) = \frac{b_{0X} + b_{1X}z^{-1} + b_{2X}z^{-2}}{1 + a_{1X}z^{-1} + a_{2X}z^{-2}}$$

where a section index X ranges from 0 to 3, representing the four second order filter sections. The filter coefficients are calculated at runtime using a set of polynomials and a gain calculation that ensures unity DC gain. The $a_1$ and $a_2$ terms for each particular section are calculated from a respective set of second-order polynomials based on bandwidth position index i as follows:

$$a_1 = p_{0,1} + (p_{1,1} \cdot i) + (p_{2,1} \cdot i^2), \text{ and}$$

$$a_2 = p_{0,2} + (p_{1,2} \cdot i) + (p_{2,2} \cdot i^2).$$

To ensure gain matching for each section, the gain of each section may be forced to be a predetermined constant such as unity gain (i.e., a gain of 0 dB) at all sections. Alternatively, other gain values or different gain values for different filter sections can be employed. Unity gain provides good performance and allows an efficient calculation for the b terms based on the a terms within a particular filter section. For example, in a Butterworth implementation, the following calculations derive the b terms from the a terms:

$$b_0 = \frac{(1 + 2a_1 + 2a_2)}{4}$$

$$b_1 = 2 \cdot b_0; \text{ and}$$

$$b_2 = b_0.$$

Depending upon hardware considerations, the b terms can also be calculated as follows:

$$b_1 = 0.25 + 0.5 \cdot a_1 + 0.5 \cdot a_2;$$

$$b_0 = b_1 \div 2; \text{ and}$$

$$b_2 = b_0.$$

Figure 8:
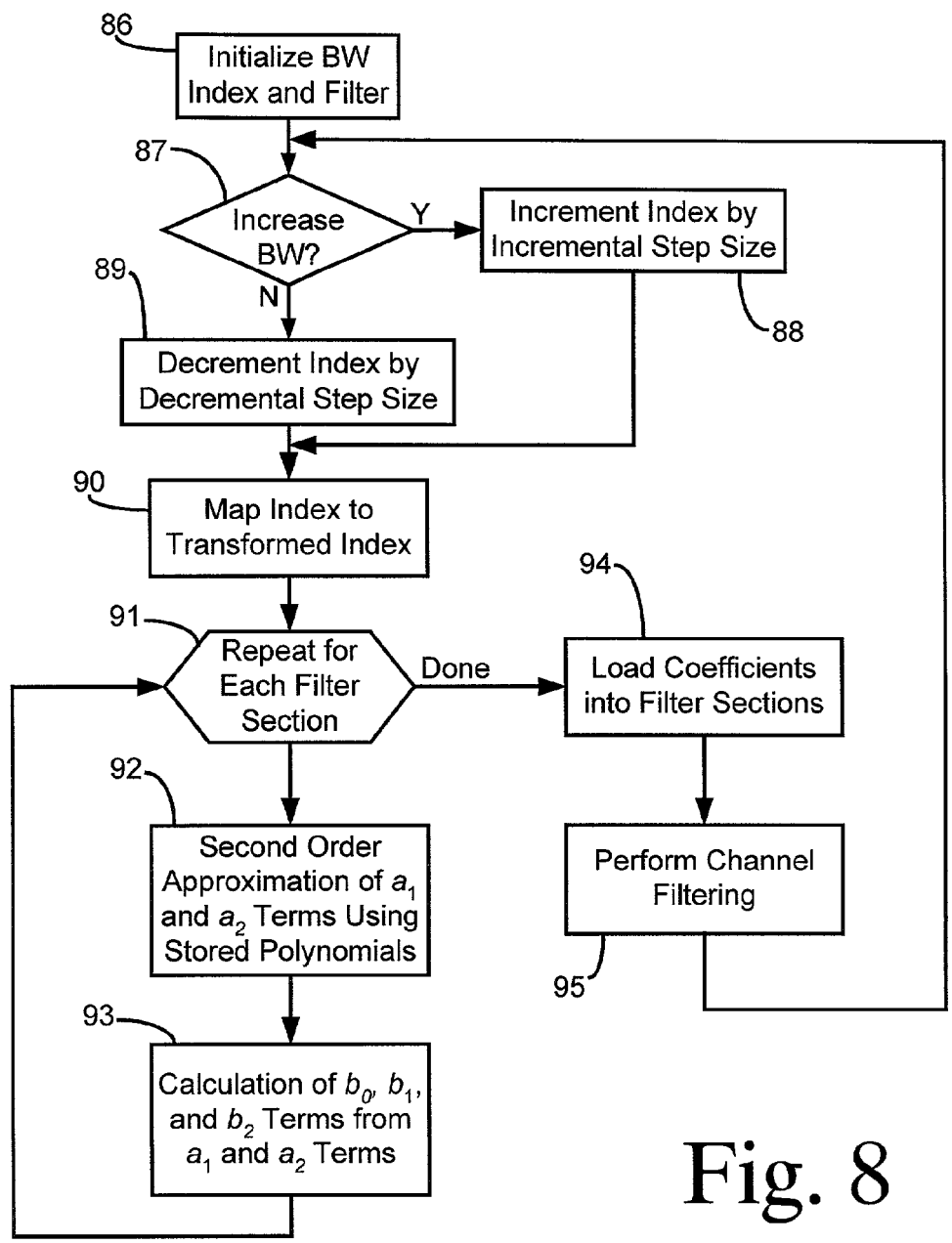
FIG. 8 is a flowchart showing a preferred embodiment of operating a DSP radio receiver using polynomial approximations to obtain sets of filter coefficients.

Run-time operation of a radio receiver employing this invention is shown in FIG. 8. In step 86, the bandwidth of the channel filter and the corresponding index are initialized (e.g., the receiver may initially employ the narrowband filter until good reception conditions are detected). In step 87, a determination is made whether or not bandwidth should be increased (or decreased or left unmodified). If an increase is to be made, then the bandwidth position index i is incremented by an incremental step size in step 88. If an decrease is to be made, then the bandwidth position index i is decremented by a decremental step size in step 89. In a preferred embodiment, index i varies between 0 and 1, with 0 representing the narrowest filter (i.e., lowest cutoff frequency) and 1 representing the widest filter. Filter resolution (i.e., the number of intermediate filters that can be obtained between the endpoint wide and narrow filters) can be equal to the numerical resolution of the DSP, although a much lower resolution would be used in a slewing application. The incremental step size is not necessarily equal to the decremental step size since it may be advantageous to slew more quickly when narrowing the bandwidth. If incrementing or decrementing the index would result in an index outside of the range, then the index is set to 0 or 1, respectively.

Figure 9:
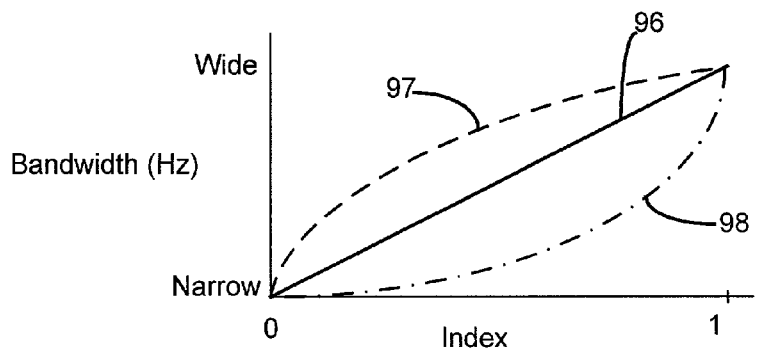
FIG. 9 is a plot showing alternative embodiments for processing a bandwidth index that is input to the filter coefficient polynomials.

The step sizes during a slewing in one direction are also not necessarily all equal. It may be desirable to change the pace at which slewing progresses. Thus, an optional step 90 can be used to map the initial index to a transformed index to provide a nonlinear spacing of the intermediate filters across the range of cutoff frequencies used during slewing. FIG. 9 shows a plot 96 of an untransformed index that varies the bandwidth or cutoff frequency linearly. Plots 97 and 98 show examples of a nonlinear correlation between the index and the intermediate frequency bandwidth. These nonlinear correlations can be obtained using respective second-order polynomials for transforming the index, for example. Thus, the initial index value may be stepped in equal step sizes between 0 and 1, but is then transformed using a polynomial so that a nonlinear change in step size is obtained as shown by plots 97 or 98. Furthermore, this transformation can be modified during operation of the receiver depending upon various factors such as the severity of an interference condition or the weakness of a received signal.

Based on the final index (transformed or not), an intermediate bandwidth filter is obtained beginning at step 91 wherein filter coefficients are calculated for each filter section. Best performance is obtained by slewing coefficients in every section, but the present invention includes slewing of less than all of the sections. For the current section being determined, second-order polynomial approximations of the $a_1$ and $a_2$ terms are made using the previously derived and stored corresponding polynomials in step 92. In step 93, the $b_0$, $b_1$, and $b_2$ terms a calculated from the values of the $a_1$ and $a_2$ terms for the current section. A return is made to step 91 and steps 92 and 93 are repeated until a filter coefficients have been determined.

Once they are all determined, the coefficient values are loaded into the filter sections in step 94 and channel filtering is performed in step 95 using the new intermediate filter. A return is made to step 87 to determine which direction, if any, is necessary for further slewing.

If desired, additional steps may be performed to determine when an endpoint (i.e., maximum or minimum cutoff frequency) is reached and a separately stored set of ideal filter coefficients may be loaded into the filter sections instead of a polynomial approximation. Conversely, the lower and upper bandwidth extremes of a particular filter can be controlled by imposing minimum and maximum values on the bandwidth index so that slewing is only performed over a portion of the full range for which the filter and the polynomials were originally designed (in which case the polynomial approximations are always used).

Figure 10:
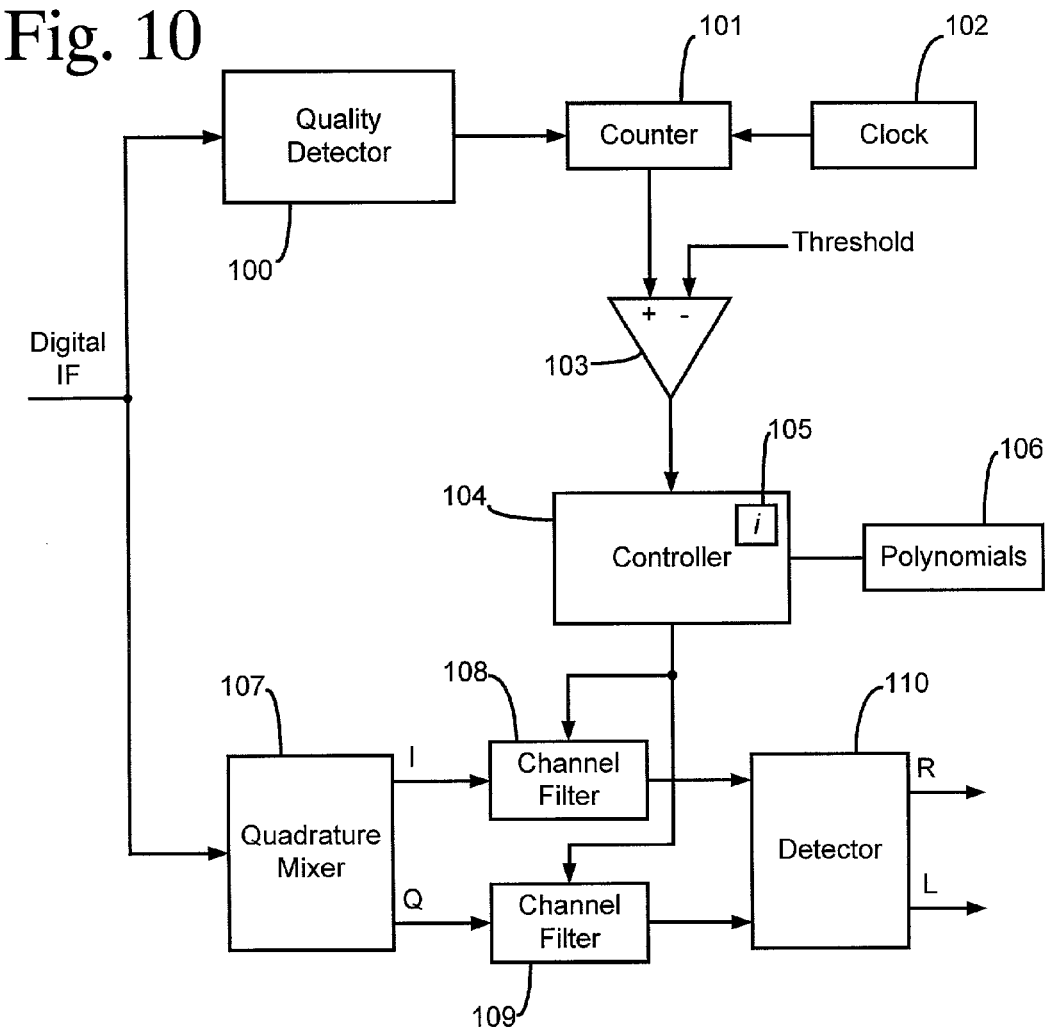
FIG. 10 is a block diagram showing a DSP radio receiver according to a one embodiment of the present invention.

Apparatus for performing the method of FIG. 8 is shown in FIG. 10. A digital IF signal (e.g., an AM radio broadcast signal) is provided to a quality detector 100 and to a quadrature mixer 107. Quality detector 100 may be an interference detector (e.g., for determining the magnitude of undesired signals at adjacent channel frequencies so that the interfering signals can be blocked out by narrowing the channel filter bandwidth) or may be a signal strength detector (e.g., for determining if the desired signal is in a weak signal condition wherein the overall signal to noise ratio can be improved by narrowing the channel filter). Detector 100 provides a low-quality indicating signal to a counter 101 which counts up during the low-quality signal at a counting frequency determined by a clock 102. After a predetermined number of counting pulses, a total count in counter 101 is compared to a threshold in a comparator 103. Thus, the low-quality (interference or weak signal) conditions must be detected for at least a predetermined average of time before a switch to the narrow bandwidth filter is indicated by comparator 103.

A controller 104 receives the output from comparator 103 and updates the bandwidth index i stored in a memory location 105 within the digital signal processor. The polynomials for obtaining the filter coefficient values are stored in a memory 106 which may also be stored as ROM data within the digital signal processor. Controller 104 determines the filter coefficient values corresponding to the current value of index i and loads them into channel filters 108 and 109, respectively, for the I and Q quadrature signals. The quadrature signals are then detected (i.e., demodulated) by a detector 110.

Figure 11:
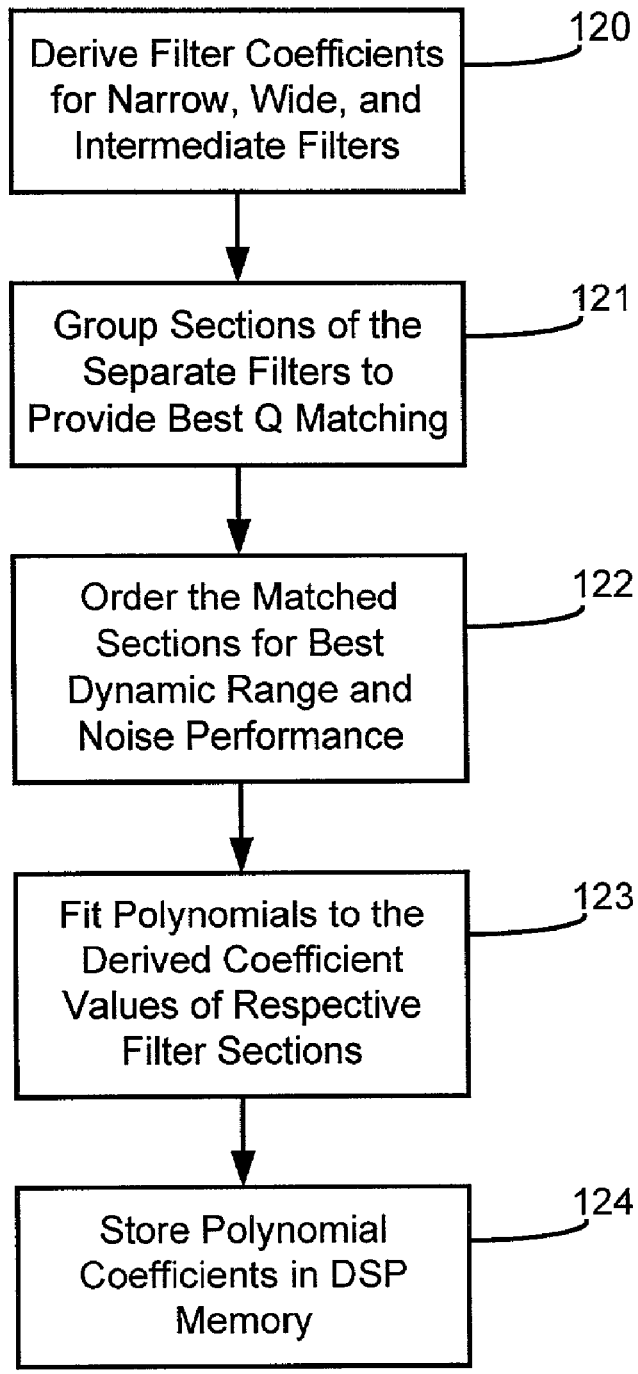
FIG. 11 is a flowchart showing one preferred embodiment for deriving polynomials to be stored in an apparatus using the present invention.

FIG. 11 shows a filter design process in greater detail. In step 120, conventional digital filter design tools may be used to obtain filter coefficients for at least the narrow, wide, and one intermediate bandwidth filter. Preferably, the intermediate bandwidth filter has a cutoff frequency halfway between the cutoff frequencies of the narrow and wide bandwidth filters. Although lowpass filters are generally shown herein, the filters could alternatively be comprised of highpass filters.

Although three ideal coefficient sets can be sufficient to determine a polynomial, better accuracy is achieved by designing additional intermediate filters to be used in determining the polynomial coefficients. For example, in a lowpass filter having a $-3$ dB cutoff frequency for the narrow filter of about 3 kHz and a $-3$ dB cutoff frequency for the wide filter of about 7 kHz, up to about 20 ideally designed filters with cutoff frequencies substantially evenly spaced from 3 kHz to 7 kHz have been employed. Alternatively, the spacings of the designed filters need not be linear. A closer spacing may be provided in portions of the range where higher accuracy of the filter coefficient sets is desired.

In step 121, the filter sections of the separately manually designed filters are respectively grouped together to provide the best available matching of Q factors. This involves independent reordering of sections of the filters. In step 122, the matched sections are mutually reordered for maximum dynamic range and noise performance as is known by those skilled in the art. In step 123, polynomials are fit to the derived coefficient value sets of the respective filter sections. Of course, the polynomial fitting could alternatively be performed prior to grouping and reordering of the coefficient values. In step 124, the polynomial coefficient sets are stored in DSP memory.

To further illustrate the design process, a more detailed example is shown. The channel filter is comprised of four cascaded second-order sections (biquads). The transfer function of each biquad is shown below.

$$H_{LP}(z) = H_C\left(\frac{(z+1)^2}{(z-p_1)(z-p_1^*)}\right) = b_0\left(\frac{1+2z^{-1}+z^{-2}}{1+a_1z^{-1}+a_2z^{-2}}\right) = \frac{b_0+b_1z^{-1}+b_2z^{-2}}{1+a_1z^{-1}+a_2z^{-2}}$$

The transfer function indicates that modifying the location of the pole ($p_1$) can be used to slew the bandwidth of the filter section. This explains why polynomial approximations are necessary for only the $a_1$ and $a_2$ terms. Given the above lowpass filter structure, if the −3 dB cutoff frequency is less than one-fourth the sampling frequency, a second order polynomial approximation can be used to represent $a_1$ and $a_2$. The b terms can then be recalculated from the new a terms to maintain unity DC gain. A set of polynomials will be derived for calculating both a terms in all the stages (e.g., 8 polynomials when using 4 second-order cascaded hR filter sections), based on a channel filter bandwidth position index as follows:

$$a_{1,x} = p_{0,1,x} + (p_{1,1,x} \cdot i) + (p_{2,1,x} \cdot i^2), \text{ and}$$

$$a_{2,x} = p_{0,2,x} + (p_{1,2,x} \cdot i) + (p_{2,2,x} \cdot i^2)$$

where p are the polynomial coefficients and i is the bandwidth index. Since the zeros of $H_{LP}$ are at the Nyquist sampling frequency, the $b_0$, $b_1$, and $b_2$ coefficients of each biquad section are efficiently calculated from the $a_1$ and $a_2$ coefficients such that the DC gain of each section is unity. Since at DC, $z = e^{j\omega} = e^{j0} = 1$:

$$b_0 = \frac{1}{\left.\frac{1+2z^{-1}+z^{-1}}{1+a_1z^{-1}+a_2z^{-2}}\right|_{z=1}} = \frac{1+a_1+a_2}{4}$$

$$b_1 = 2b_0$$

$$b_2 = b_0$$

Using conventional methods, a designer derives three different filters referred to as the narrow, mid, and wide filters. Preferably, the mid filter has a bandwidth close to the average of the narrow and wide bandwidths. Preferably, each filter is an $8^{th}$ order IIR filter with the restriction that all zeros are placed at Nyquist frequency. Designing each filter as a Butterworth or composition of Butterworth sections meets this criteria.

After the conventional (i.e., ideal) filters are designed, their transfer functions are converted into second order sections (biquads). Preferably, each section may have unity DC gain and a zero at Nyquist frequency.

The biquad sections of the narrow, mid, and wide filters are grouped together based on the general shape of the each section's magnitude response. For example, the section with the highest Q in the narrow filter should be grouped with the highest Q sections of the mid and wide filters, etc. A straightforward approach is to order the biquad sections such that the poles are in descending order. Grouping of sections helps minimize transient response when switching between filters.

The groups of biquad sections are subsequently reordered for dynamic range considerations and excess noise minimization. For dynamic range considerations, it is preferable to ensure that maximum signal levels are not exceeded at the output of each of the intermediate sections. Excess noise refers to the shape of truncation noise as it propagates through subsequent cascaded filter sections. The ordering of sections is chosen to minimize excess noise. A simple method is to order the sections of the mid filter for dynamic range considerations and excess noise, and then reorder the narrow and wide filters to maintain the same groupings derived above. An alternate method is to attempt to minimize noise based on all three filters.

Second order polynomials for modeling the filter coefficient values is created to approximate the $a_1$ and $a_2$ coefficients. Only the $a_1$ and $a_2$ coefficients are required because $b_0$, $b_1$, and $b_2$ are dynamically calculated based on $a_1$ and $a_2$. In some DSP implementations, it may be desirable to scale all of the $a_1$ and $a_2$ coefficients down by a factor of 2 to reflect hardware implementation. Hence, the polynomial approximations would represent the actual a coefficients divided by 2.

Preferably, for each of the scaled $a_1$ and $a_2$ terms, second-order polynomials that best fit the coefficient sets of each filter section are derived using the least squares approach. This method determines the polynomial coefficient vector, p, that minimizes the squared error, $\|e\|^2$, as given below:

$$\min_p \|e\|^2 = \min_p \left\|\frac{a}{2} - ind \cdot p\right\|^2$$

where ind is the matrix of indices for the polynomial, and a is the vector of filter coefficient sets for the narrow, mid, and wide filters (or more sets if more ideal filters are designed). A solution, which is simplified by invoking the orthogonality principle, is explicitly given below:

$$\begin{bmatrix} p_0 \\ p_1 \\ p_2 \end{bmatrix} = \begin{bmatrix} 1 & ind_{narrow} & ind_{narrow}^2 \\ 1 & ind_{mid} & ind_{mid}^2 \\ 1 & ind_{wide} & ind_{wide}^2 \end{bmatrix}^{-1} \begin{bmatrix} a_{narrow}/2 \\ a_{mid}/2 \\ a_{wide}/2 \end{bmatrix}$$

Since the bandwidth index ranges from 0 to 1, the values for $ind_{narrow}$, $ind_{mid}$, and $ind_{wide}$ are equal to 0, 0.5, and 1, respectively. Hence, the solution above becomes:

$$\begin{bmatrix} p_0 \\ p_1 \\ p_2 \end{bmatrix} = \begin{bmatrix} 1 & 0 & 0 \\ 1 & 0.5 & 0.25 \\ 1 & 1 & 1 \end{bmatrix}^{-1} \begin{bmatrix} a_{narrow}/2 \\ a_{mid}/2 \\ a_{wide}/2 \end{bmatrix}$$

A total of 8 sets of polynomial equations are generated to define the $a_1$ and $a_2$ coefficients for each of the 4 biquad sections. The resulting polynomial coefficients are then written to the processor memory.

What is claimed is:

1. A method of slewing a bandwidth characteristic of a digital filter within a range between a fast bandwidth characteristic and a second bandwidth characteristic, said digital filter including a plurality of cascaded filter sections, each of said sections having respective coefficients, wherein each of said filter sections is comprised of a second order filter having coefficients $a_1$, $a_2$, $b_0$, $b_1$, and $b_2$, said method comprising the steps of:

determining an index value for identifying a desired bandwidth characteristic within said range;

interpolating values for said coefficient values for said $a_1$ and $a_2$ coefficients of a respective filter section in response to said index value;

deriving coefficient values for said $b_0$, $b_1$, and $b_2$ coefficients in response to said coefficient values for said $a_1$ and $a_2$ coefficients such that said $b_0$, $b_1$, and $b_2$ coefficient values provide a matched unity gain for said respective filter section; and loading said coefficient values into said respective filter section;

wherein said digital filter is a low pass filter and wherein said $b_0$, $b_1$, and $b_2$ coefficient values are determined according to the relationships:

$b_1 = 0.25 + 0.5 \cdot a_1 + 0.5 - a_2$;

$b_0 = b_1 \div 2$; and $b_2 = b_0$.

2. A method of slewing a bandwidth characteristic of a digital filter within a range between a first bandwidth characteristic and a second bandwidth characteristic, said digital filter including a plurality of cascaded filter sections, each of said sections having respective coefficients, wherein each of said filter sections is comprised of a second order filter having coefficients $a_1$, $a_2$, $b_0$, $b_1$, and $b_2$, said method comprising the steps of:

determining an index value for identifying a desired bandwidth characteristic within said range;

interpolating values for said coefficient values for said $a_1$ and $a_2$ coefficients of a respective filter section in response to said index value;

deriving coefficient values for said $b_0$, $b_1$, and $b_2$ coefficients in response to said coefficient values for said $a_1$ and $a_2$ coefficients such that said $b_0$, $b_1$, and $b_2$ coefficient values provide a matched unity gain for said respective filter section; and loading said coefficient values into said respective filter section;

wherein said digital filter is a lowpass filter and wherein said $b_0$, $b_1$, and $b_2$ coefficient values are determined according to the relationships:

$$b_0 = \frac{(1 + a_1 + a_2)}{4}$$

$b_1 = 2b_0$; and $b_2 = b_0$.

* * * * *